United States Patent
Maringer

[11] 3,982,193
[45] Sept. 21, 1976

[54] CIRCUIT ARRANGEMENT FOR GENERATING A SAMPLING PULSE RASTER ADAPTED TO THE VARIABLE PERIOD OF QUASIPERIODIC EVENTS

[75] Inventor: Albert Maringer, Karlsruhe, Germany

[73] Assignee: Siemens Aktiengesellschaft, Munich, Germany

[22] Filed: Dec. 20, 1974

[21] Appl. No.: 534,832

[30] Foreign Application Priority Data
Dec. 21, 1973 Germany............................ 2364154

[52] U.S. Cl.............................. 328/151; 328/127; 328/129; 307/235 B; 307/271
[51] Int. Cl.² ................. H03K 3/84; H03K 21/30; H03K 3/72
[58] Field of Search .......... 328/147, 128, 151, 129, 328/127; 307/271, 235 B

[56] References Cited
UNITED STATES PATENTS

| | | |
|---|---|---|
| 3,566,283 | 2/1971 | Diebler .................... 307/271 X |
| 3,714,470 | 1/1973 | Goldberg .................... 307/271 X |
| 3,743,946 | 7/1973 | Gass et al. .................... 328/147 X |
| 3,745,420 | 7/1973 | Hafner .................... 307/271 X |
| 3,750,036 | 7/1973 | Burrows et al. .................... 328/151 |
| 3,783,393 | 1/1974 | Kakiura .................... 328/128 X |
| 3,810,029 | 5/1974 | Barthelemy .................... 328/151 X |

Primary Examiner—John S. Heyman
Attorney, Agent, or Firm—Kenyon & Kenyon Reilly Carr & Chapin

[57] ABSTRACT

The invention is a circuit for generating a sampling pulse raster which has a pulse repetition frequency proportional to periodic events with variable period, which are to be sampled. The sampling pulses can be taken off at the counting stages of a pulse counter the counting input of which is connected to the output of a voltage-frequency converter. The voltage-frequency converter has two inputs: one for a voltage proportional to the period of the periodic events; another for a voltage proportional to the selected number of sampling pulses per period. The first voltage controls the frequency of the output pulses of the voltage-frequency converter in an inversely proportional sense.

8 Claims, 5 Drawing Figures

CIRCUIT ARRANGEMENT FOR GENERATING A SAMPLING PULSE RASTER ADAPTED TO THE VARIABLE PERIOD OF QUASIPERIODIC EVENTS

BACKGROUND OF THE INVENTION

1. Field of the Invention

The invention concerns a circuit for generating a sampling pulse raster having a pulse repetition frequency proportional to the variable period of sampled quasiperiodic events.

2. Description of the Prior Art

For analyzing the waveform of a periodic event it is useful if a normalized pulse raster is overlaid on the period of the electrical signal representing the process. This raster divides the curve into sections which can then be sampled and analyzed. In the German Offenlegungsschrift 2,040,913, for instance, an arrangement is described by which the wave shape of the ignition voltage curve of an internal-combustion engine is ascertained by samples taken at definite points in time. In order to do this, several measuring channels assigned to a respective section of the ignition voltage curve are opened at definite points in time, which are predetermined by the underlying time raster, for receiving and possibly evaluating the characteristic signals contained in the ignition voltage curve. The opening is accomplished by means of a control unit which is equipped with time steps built up by a sequence of monostable multivibrators. By means of this prior art arrangement, a fixed time raster is therefore overlaid on the process to be examined. This method is therefore applicable only if the period of the events to be examined is constant. In the case of an ignition voltage analyzer, this would mean that the internal-combustion engine can be examined only at a constant speed. Such a limitation, however, often does not do justice to the requirements of practical operation.

It is an object of the invention to provide a circuit for generating a sampling pulse raster wherein its repetition frequency is proportional to the variable period of quasiperiodic processes.

SUMMARY OF THE INVENTION

This object is met by providing a voltage-frequency converter for a raster-proportional input voltage which has an additional second input which inversely proportionally influences the converter as to the frequency of its output signal and to which a normalized voltage is applied which is integrated over the period in an integrator, and that the sampling pulse raster is derived from the signal taken off at the output of the converter.

This assures that the same number of raster pulses always is alotted to periods of different duration.

If the resolution of the observed events due to the underlying raster is relatively high, i.e., with many raster pulses per period of the event, synchronization of the raster with the event is unnecessary. For few raster pulses per period, however, it is advisable to let the output signal of the frequency converter be triggered by the start of the observed event. Approximate synchronization of the raster with the events is achieved by the provision that the output signal of the voltage-frequency converter is fed to the counting input of a pulse counter which has a start-stop input addressed by a pulse which marks the beginning of the event. Raster signals can be taken off at the counter stage outputs of the counter, by means of a decoder if appropriate.

A circuit which contains a Miller integrator advantageously serves as the voltage-frequency converter. For synchronizing the raster with the events to be examined, a trigger pulse derived from the start of the event is then applied to a control terminal of a trigger circuit which discharges the capacitor of the Miller integrator.

The integrator which integrates a normalized voltage over the period may be designed as a digital integrator or an analog integrator.

It is advantageous to associate the sampling pulse raster with the quasiperiodic events by means of a measured-value storage device for individual characteristic values of the event.

The repetition frequency of the sampling pulse raster is adapted to the changing periods of the events always after a measurement of the respective period by integration of a normalized voltage over the duration of the period. It is therefore helpful if the sampling pulse raster is associated with the events which are delayed by the respective event period.

The invention is used to advantage in an ignition voltage waveform analyzer for an internal-combustion engine.

DESCRIPTION OF THE INVENTION

Figure 1:
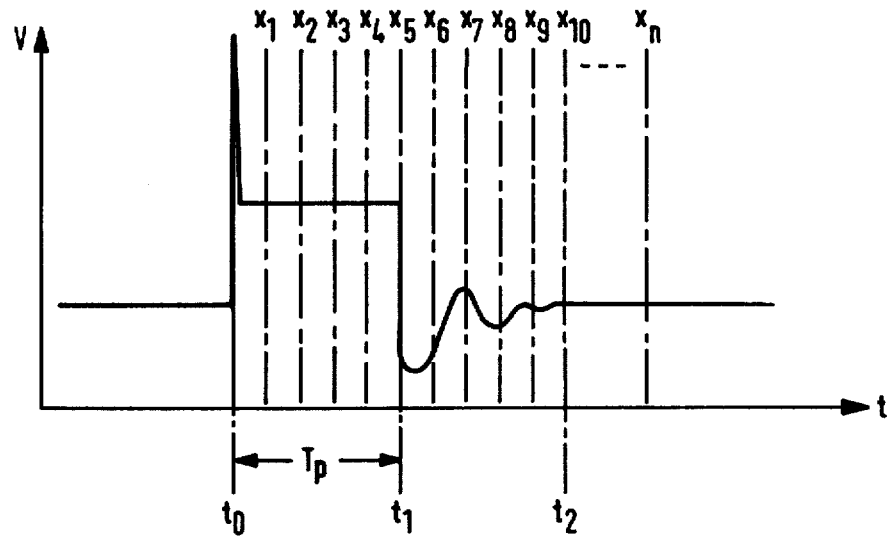
FIG. 1 shows a quasiperiodic event to be analyzed.

As an example of a quasiperiodic event, the ignition voltage wave-form of an internal-combustion engine with external ignition is plotted in FIG. 1. The process starts as $t_0$ and ends at $t_2$. It is repeated in each cylinder of the engine. If the engine runs at higher speed, the ignition process must take place in a shorter time. The time interval between $t_0$ and $t_2$ is shortened accordingly without appreciable change in the characteristic features of the wave shape. Among these features are the spike at the beginning of the ignition voltage curve, the approximately horizontal portion following it and then following, likewise steep decay of the ignition voltage, which continues with a damped oscillation. To analyze such a voltage wave form, it is sufficient to sample the curve at certain points and to examine the measured values obtained in this way. For this purpose it is helpful to overlay a time raster on the curve. This raster is designated in FIG. 1 with $x_1 \ldots x_n$ and entered as a time sequence of dot-dashed vertical lines. It is easy to see that if the time spacing between $t_0$ and $t_1$ is, for instance, shortened, a relative adaption of the raster, i.e., the same number of raster points in the shortened time, requires an increased raster pulse repetition frequency. The time spacing between $t_0$ and $t_1$ is designated as $T_p$, where $T_p$ is the duration of the period. It will easily be seen that instead of the duration of the entire period, the duration of a characteristic part of the entire period can be used, as is done in the example. The period of the raster pulse sequency $T_h$ is then obtained as $$T_h = T_p/n \qquad (1)$$

when $n$ is a fixed number of raster pulses per period $T_p$. For the repetition frequency of the raster pulses one then has $$f_h = (n/T_p) k_1. \qquad (2)$$

where $k_1$ is a constant.

Figure 2:
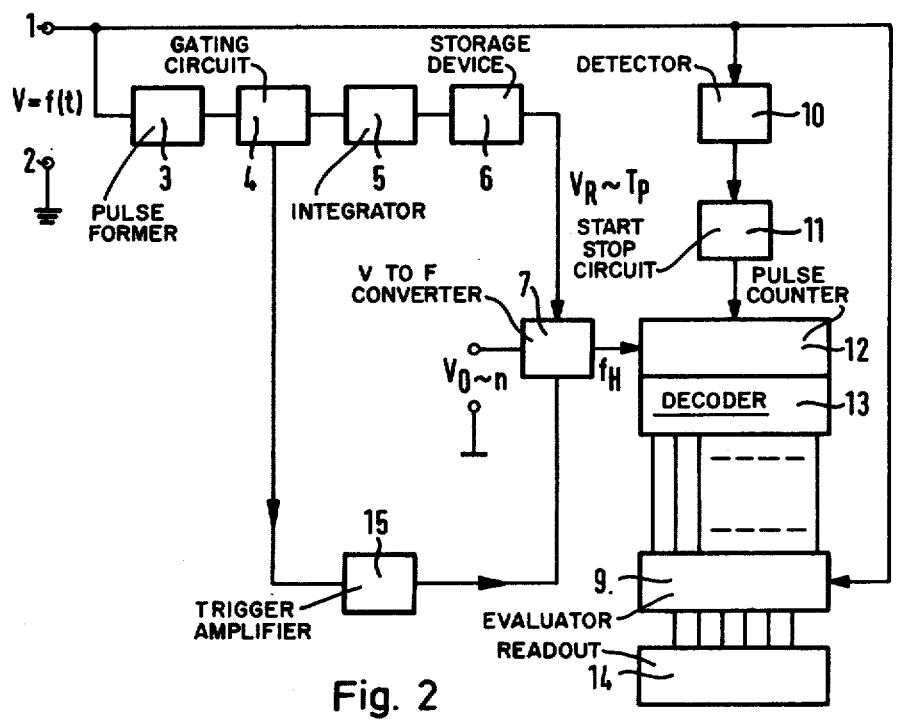
FIG. 2 shows an embodiment example of the invention as a block diagram.

In FIG. 2 an example of an embodiment of the invention is shown. Here, a circuit is disclosed which makes it possible to realize electrically the last-mentioned equation for the frequency of the raster pulse sequence. For this purpose, a voltage V representing the process to be examined is connected to two input terminals 1 and 2, of which the terminal 2 is grounded. The terminal 1 is connected, first, with the input of the pulse former 3 which generates from the voltage V a pulse of duration $T_p$. The output of the pulse former 3 is connected to the input of a gating circuit 4. The output of the gating circuit is connected with the input of an integrator 5. By means of the gating circuit 4, the integrator receives a normalized voltage for the duration of the time elapsed between the points in time $t_0$ and $t_1$; this voltage is integrated in the integrator 5 during the mentioned time. The output voltage of the integrator is applied to the input of a storage device 6. The output of the storage device 6 is connected to an auxiliary input of a voltage-frequency converter 7. To the main input of the voltage-frequency converter is applied a voltage $V_0$, which is proportional to the number of raster pulses per event period. The terminal 1 is further connected with the input of an evaluator circuit 9, which may consist, for instance, of individual measured-value storage cells.

The terminal 1 is furthermore connected to the input of a detector 10 for the start of the event to be examined, which controls a start-stop input of a pulse counter 12 by way of a start-stop circuit 11 connected to the output of the detector. The counting input of the pulse counter 12 is connected with the signal output of the voltage-frequency converter. The outputs of the counting stages of the counter 12 are connected to corresponding inputs of the evaluator circuit 9 by way of a decoder 13. In this manner, the individual measured-value storage cells are assigned to individual raster pulses. Connected parallel to the evaluator circuit 9 is a readout unit 14 which may consist, for instance, of a printer or a display. Through the start-stop circuit 11, a certain degree of synchronization of the raster with the event to be analyzed is obtained. For exact synchronization of the raster with the event to be analyzed, a trigger amplifier 15 is provided, which releases from the gate circuit 4 a first output pulse of the voltage-frequency converter 7 at the time $t_0$.

To display the event to be analyzed, together with the underlying raster, on the picture screen of an oscilloscope, one could dispense with the counter and apply the output pulses of the voltage-frequency converter 7 to the vertical deflection plates of the oscilloscope together with the delayed event. One can also perform an analysis similar to the method used in a sampling oscilloscope. A first part of the event is analyzed here during a preceding period, and a second part during a succeeding period.

Figure 3:
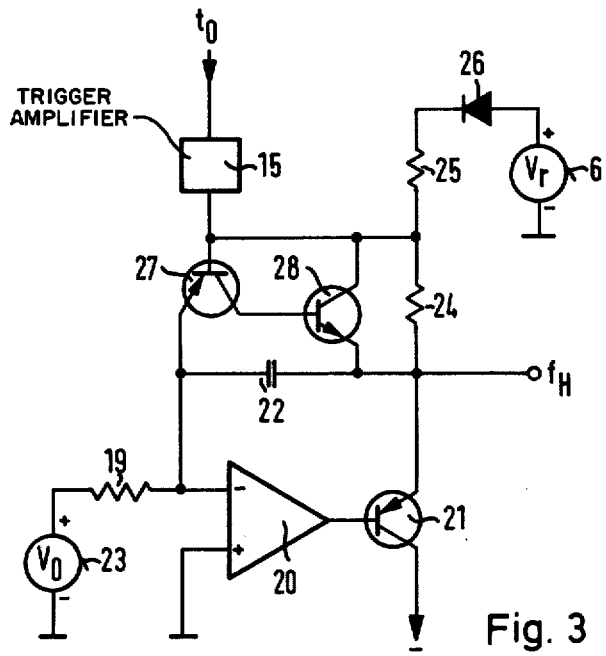
FIG. 3 shows the design of a voltage-frequency converter used in the example of the embodiment.

In FIG. 3, the circuit diagram of a voltage-frequency converter is shown. An essential component of this voltage-frequency converter is a Miller integrator which consists of an operational amplifier 20, an output amplifier 21 connected to the output of the operational amplifier 20 and a capacitor 22, which provides negative feedback from the output of the output amplifier 21 to one of the inputs of the operational amplifier 20. The fed-back input of the operational amplifier 20 is connected by way of a resistor 19 with a voltage source 23 which furnishes a voltage $V_0$ proportional to the raster number n. The other input terminal of the operational amplifier 20 is grounded. The output amplifier 21 consists of a transistor, whose emitter is connected with the integration capacitor 22. The emitter of this transistor is furthermore connected, by way of a voltage divider consisting of the resistors 24 and 25 and by way a diode 26, with a voltage source 6, which furnishes a voltage $V_r$ proportional to the duration $T_p$ of the period. In FIG. 2, this voltage source is represented by the storage device 6. The output signal of the voltage-frequency converter is likewise taken off at the emitter of the output amplifier 21. The junction point of the two resistors 24 and 25 is connected with the base and the collector, respectively, of two transistors 27 and 28, which are of opposite conduction type and together constitute a "unijunction" transistor. To this end, the collector of the transistor 27 is connected to the base of the transistor 28. The two emitters are each connected to one of the electrodes of the capacitor 22. The combination consisting of the transistors 27, 28 acts as a trigger which discharges the capacitor 22 if the latter is charged to a voltage predetermined by the voltage source 6 and the voltage divider formed by the resistors 24 and 25. To the base of the transistor 27 is furthermore connected the output of the trigger amplifier 15, which serves for the synchronization of the voltage-frequency converter with the event to be examined. A possible temperature dependence of the transistors 27 and 28 is to be compensated by the temperature dependence of the diode 26. The frequency of the output signal of the voltage-frequency converter is proportional to the voltage $V_0$ and proportional to the resistance value of the resistor 25 and inversely proportional to the voltage $V_r$ and the resistance values of the resistors 19 and 24 and the capacity of the capacitor 22.

Figure 4:
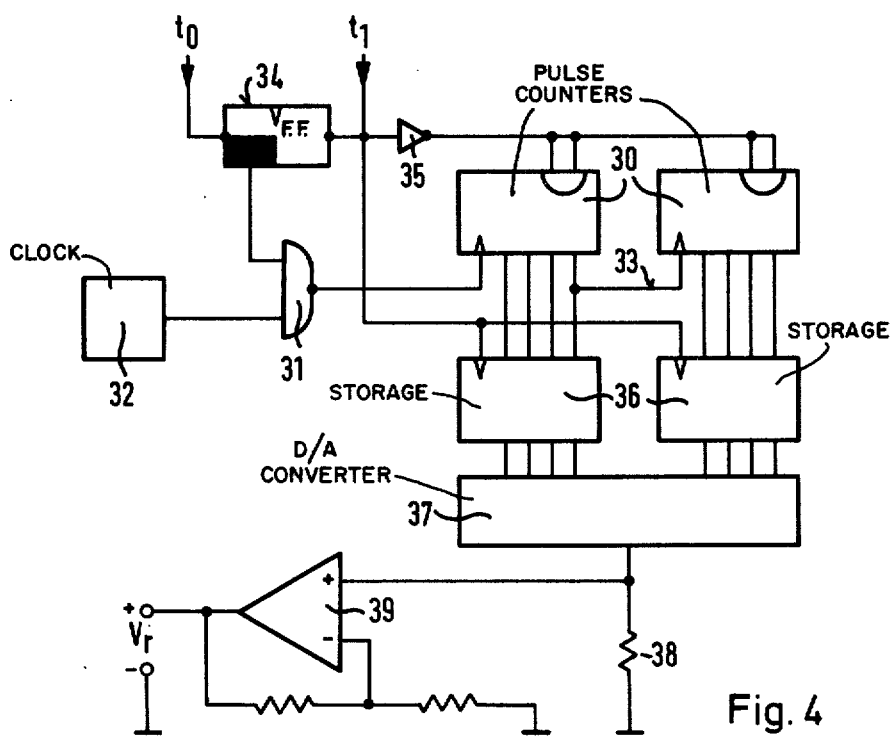
FIG. 4 shows a digital integrator for integrating a normalized voltage over the duration of the period.

In FIG. 4, an embodiment example of an integrator 5 according to FIG. 2 is shown. This is a digital integrator. Its essential component is a pulse counter 30 which consists of two decades and which is driven by counting pulses of a clock generator 32 via a NAND gate 31. The last stage of the first decade of the counter 30 is connected by a carry connection 33 to the first stage of the second decade of the counter 30. A second input of the NAND gate 31 is connected with the output of a flipflop 34. Two control inputs of this flipflop are connected with pulse lines by means of which pulses derived from the point in time $t_0$ and the point in time $t_1$, respectively, control the flipflop 34 into one of its output states. The pulse input for a pulse marking the point in time $t_1$ is connected by way of an inverting amplifier 35 to reset inputs of the two decades of the counter 30. Directly connected with the input of the pulse marking the point in time $t_1$ are control inputs of two decades of a store 36, which are connected to the corresponding outputs of the decades of the counter 30. Output terminals of the decades of the store 36 are connected with corresponding inputs of a digial-to-analog converter 37, whose output signal is connected to a load resistor 38. The voltage dropping across the resistor 38 is applied to an operational amplifier 39, at the output of which a voltage $V_r$, integrated over the duration of the period of the event to be examined, can be taken off.

The function of the digital integrator according to FIG. 4 is that a counting pulse sequence with constant frequency is integrated into the counter 30 during the integration time determined by the flipflop 34. Before the counter 30 is reset by a pulse marking the point in time $t_1$, the then existing count is transferred to the storage device 36. The stored number of the pulses integrated over the duration of the period is converted in the digital-to-analog converter 37 into a voltage proportional to the number. This voltage is amplified in the operational amplifier 39.

Figure 5:
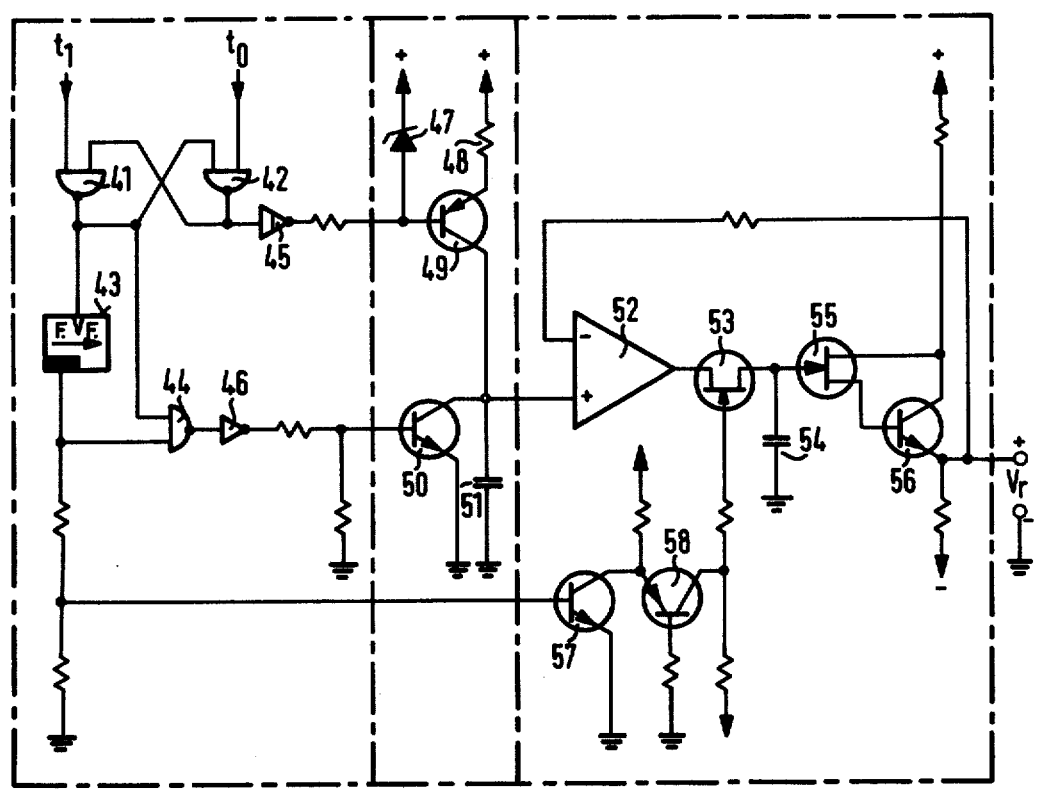
FIG. 5 shows an analog integrator for the same purpose.

In FIG. 5, an analog integrator serving the same purpose is shown. This integrator has three parts, which are framed by dash-dotted lines. The first part of the circuit serves for the control of the integrator and consists of a flipflop built of two NAND gates 41 and 42. Part of the control portion is furthermore a monoflop (one-shot multivibrator) 43, whose input is connected with the one output of the flipflop. The same output of the flipflop is also connected with the input of a NAND gate 44, which is also part of the control portion. Another input of the NAND gate 44 is connected with the output of the monoflop 43. The other output of the flipflop, which is represented by the output of the NAND gate 42, is connected with the input of an inverter 45 and the output of the NAND gate 44 is connected with the input of an inverter 46. The output of the inverter 45 is connected with the base electrode of a transistor 49. The voltage at the base electrode of the transistor 49 is stabilized by a Zener diode 47. The transistor 49, the Zener diode 47 and a resistor 48 together form a constant-current source, which is switched-on by way of the inverting amplifier 45 and then charges a capacitor 51 which is connected to the collector of the transistor 49. A transistor 50 is shunted across the capacitor 51 and is controlled by way of its base electrode from the output of the inverter amplifier 46. The Zener diode 47, the resistor 48, the transistor 49, the capacitor 51 and the transistor 50 together form the integration part of the circuit according to FIG. 5.

The ungrounded electrode of the capacitor 51 is tied to the input terminal of an operational amplifier 52. The output of the operational amplifier 52 is connected by way of the source-drain path of a field-effect transistor 53 with the ungrounded electrode of a capacitor 54. The gate electrode of the field-effect transistor is controlled by way of an amplifier consisting of the transistors 57 and 58, by a signal which is derived directly from the output signal of the monoflop 43. The charging voltage of the capacitor 54 is applied to the gate electrode of a second field-effect transistor 55, which drives an output-stage transistor 56. The emitter electrode of the transistor 56, from which the output voltage of the entire integration circuit can be taken off, is connected via a resistor with the second input of the operational amplifier 52. The part of the circuit which begins with the operational amplifier 52 can be considered as the storage device.

The operation of the circuit according to FIG. 5 can be described as follows: During the time interval from $t_0$ to $t_1$ the integrator integrates, because at the point in time $t_0$ the flipflop consisting of the NAND gates 41 and 42 is set and switches on, via the inverter 45, the current source consisting of the Zener diode 47, the resistor 48 and the transistor 49. The current of this current source is integrated in the capacitor 51. At the point in time $t_1$ the flipflop consisting of the NAND gates 41 and 42 is reset and thereby interrupts the current from the current source. At the same time, the monoflop 43 is triggered. During its running time, the voltage present at the capacitor 51 is transferred to the storage capacitor 54 by way of the transistors 57 and 58 and via the field-effect transistor 54. After the voltage value is stored in the capacitor 54, the integration capacitor 51 is discharged via the NAND gate 44, the inverter 46 and the transistor 50. Therewith, the circuit is ready for another integration.

With the circuit according to the invention, an analyzing equipment can be realized which permits also analysis of higher order in the examination of quasiperiodic events. For instance, the integration of differentiation of a functional part of the event examined can also be performed.

What is claimed is:

1. A circuit for generating a sampling pulse raster wherein its repetition frequency is adapted to the variable period of quasiperiodic events, comprising,
   a voltage-frequency converter having at least a first input terminal and a second input terminal,
   means for applying to said first input terminal a first voltage proportional to the total number of sampling raster points,
   means for applying to said second input terminal a second voltage proportional to the period of said event being sampled,
   an output terminal of said converter at which the converter output voltage frequency is inversely proportional to said second voltage and directly proportional to said first voltage, and
   means for generating a sampling pulse raster from the signal at said converter output terminal, said means comprising,
   a multiple counting stage pulse counter to one input of which is applied the voltage-frequency converter output signal,
   a start-stop circuit which is addressed by a pulse marking the beginning of the event, connected to a second input of said pulse counter, and
   means for generating raster signals from the counting stage outputs of said counter.

2. The circuit of claim 1 further comprising a voltage-frequency converter with a third input terminal whereby the signal at said converter output terminal is triggered by the start of the event.

3. The circuit of claim 2 wherein said voltage-frequency converter comprises a Miller integrator.

4. The circuit of claim 3 wherein a trigger pulse derived from the start of the event is applied to a control terminal of a trigger circuit discharging the capacitor of the Miller integrator.

5. The circuit of claim 1 wherein said second voltage proportional to the period of said event being sampled is a digital integrator circuit.

6. The circuit of claim 1 wherein said second voltage proportional to the period of said event being sampled is an analog integrator circuit.

7. The circuit of claim 1 further comprising a measured-value storage device of which individual measured-value storage cells are gated by the individual raster signals from the counting stage outputs of said pulse counter.

8. The circuit of claim 1 wherein said sampling pulse raster is associated with events delayed by the duration of one respective period of the event.

* * * * *